United States Patent
Bet-Shliemoun

(10) Patent No.: US 7,964,956 B1
(45) Date of Patent: Jun. 21, 2011

(54) CIRCUIT PACKAGING AND CONNECTIVITY

(75) Inventor: Ashur S. Bet-Shliemoun, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 567 days.

(21) Appl. No.: 11/953,735

(22) Filed: Dec. 10, 2007

(51) Int. Cl.
 *H01L 23/48* (2006.01)
(52) U.S. Cl. .. 257/694; 257/696; 257/697; 257/E23.068
(58) Field of Classification Search .................. 257/694, 257/696, 697, E23.068
See application file for complete search history.

(56) References Cited

U.S. PATENT DOCUMENTS

| | | | | |
|---|---|---|---|---|
| 4,673,967 A * | 6/1987 | Hingorany | ..................... | 257/696 |
| 5,041,901 A * | 8/1991 | Kitano et al. | ................... | 257/779 |
| 5,334,804 A * | 8/1994 | Love et al. | ..................... | 174/267 |
| 5,625,944 A * | 5/1997 | Werther | .......................... | 29/843 |
| 5,723,902 A * | 3/1998 | Shibata et al. | ................ | 257/692 |
| 5,808,357 A * | 9/1998 | Sakoda et al. | ................. | 257/693 |
| 5,861,663 A * | 1/1999 | Isaacs et al. | .................... | 257/697 |
| 6,215,670 B1 * | 4/2001 | Khandros | ....................... | 361/774 |
| 6,271,583 B1 * | 8/2001 | Sakoda et al. | ................. | 257/693 |
| 6,300,678 B1 * | 10/2001 | Suehiro et al. | ................ | 257/697 |
| 6,727,579 B1 * | 4/2004 | Eldridge et al. | .............. | 257/692 |
| 2007/0007640 A1 * | 1/2007 | Harnden et al. | .............. | 257/690 |

* cited by examiner

*Primary Examiner* — Nitin Parekh
(74) *Attorney, Agent, or Firm* — Brooks Kushman P.C.

(57) ABSTRACT

The present disclosure describes a unique pin configuration for mounting of circuit packages to corresponding host circuit boards. For example, an apparatus according to embodiments herein comprises a circuit, a substrate, and multiple conductive leads. The substrate has a surface on which the circuit (e.g., an integrated circuit) is mounted. The multiple conductive leads extend, in an orthogonal manner relative to the surface, through the substrate to electrically connect the circuit to a host circuit board. According to one embodiment, each respective conductive lead of the multiple conductive leads has been altered to produce a contact element (e.g., an L-shaped bend, J-shaped bend, etc.) at an axial end of the respective conductive lead opposite the substrate to solder the axial end of the respective conductive lead (i.e., contact element) to a surface mount pad of the host circuit board.

10 Claims, 7 Drawing Sheets

CIRCUIT PACKAGING AND CONNECTIVITY

BACKGROUND

There currently are a number of different lead or pin styles for connecting integrated circuit packages to corresponding circuit boards. For example, conventional leads/contacts include: J-leads, gull-wing leads, C-bend leads, through-hole leads, solder ball type leads, pin grid array type leads, etc.

Typically, these different types of leads are fabricated from metal and emanate from a packaged integrated circuit for connecting to a pad or through-hole of a circuit board. To ensure a good electrical connection the packaged integrated circuit and a host circuit board, a manufacturer forms a solder joint between the leads of the packaged integrated circuit and corresponding surface mount pads or through-holes on the circuit board.

Conventional techniques suffer from a number of deficiencies. For example, there has been an ever-growing need to provide yet more and more pins on circuit device packages for mounting of corresponding circuit devices to printed circuit board. An integrated circuit may include up to or more than 2500 pins (e.g., a 50×50 array of pins). It is very difficult if not impossible with today's technology to provide such a high pin count using standard Gull-wing or J-lead type packages in which the conductive leads extend laterally outward from a periphery of the device to attach the package to the printed circuit board. A conventional ball grid array may be configured to provide high pin counts based on connections beneath the circuit package to the printed circuit board. A conventional pin grid array may be configured to provide high pin counts based on connections beneath the circuit package to the printed circuit board.

SUMMARY

As discussed above, a conventional ball grid array may be configured to provide high pin counts based on connections beneath the circuit package to the printed circuit board. However, a conventional ball grid array type package and corresponding solder joints are rigid and therefore susceptible to damage when exposed to higher temperatures. Also, as discussed above, a conventional pin grid array may be configured to provide high pin counts based on connections beneath the circuit package to the printed circuit board. However, conventional pin grid array type packages are not designed for surface mount applications and, even if used in such an application, do not provide enough solder between pins and pads.

Techniques discussed herein deviate with respect to conventional methods and packaging as discussed above. For example, embodiments herein include techniques (e.g., methods, apparatus, systems, software, etc.) for providing a high pin circuit packages for surface mounting to a host substrate such as a printed circuit board. Among other benefits, alterations with respect to conventional conductive leads as discussed below increase reliability as well as enhance a number of connections between a circuit device and host printed circuit board.

More specifically, an apparatus according to embodiments herein comprises a circuit, a substrate, and multiple conductive leads. The substrate has a surface on which the circuit (e.g., an integrated circuit) is mounted. The multiple conductive leads extend, in an orthogonal manner relative to the surface (of the substrate), through the substrate to electrically connect the circuit to a host circuit board. According to one embodiment, each respective conductive lead of the multiple conductive leads has a contact element at an axial end of the respective conductive lead opposite the substrate to enhance attaching the axial end of the respective conductive lead to a surface mount pad of the host circuit board.

As will be discussed later in this specification, such a package mounted to the host circuit board (including enhanced contact elements at ends of the conductive leads) as discussed above is less susceptible to damage because the conductive leads can bend (reducing stress where the leads are mounted to the host circuit board and where the conductive leads attach to the substrate) as the substrate expands and contracts due to temperature swings. The stress may be particularly exaggerated when the substrate on which the circuit is mounted is a ceramic type substrate because ceramic tends to have higher coefficients of expansion than does other material such as plastic. However, note that because today's packages are yet larger and larger, even plastic packages are susceptible to possible damage due to expansion and contraction caused by temperature changes. The techniques as described herein reduce this susceptibility.

The contact element formed at an end of a respective pin extending from the package can be formed into a number of different shapes. For example, a contact element at an axial end of the respective conductive lead can have a larger or enhanced surface area for attaching the axial end of the respective conductive lead to the host circuit board as compared to a cross-sectional area of the respective conductive lead as viewed along an axial direction of the respective conductive lead. In other words, a conventional pin (e.g., a conventional pin grid array pin) itself may not provide enough surface area to create a solder joint for connecting the circuit package to a printed circuit board. However, enhancing the surface area of the pin where it meets the printed circuit board increases a reliability of a corresponding solder joint connection.

In one embodiment, the contact element at the end of each pin is a configuration such as a disc-shaped, square-shaped, etc. conductive element. The cross-sectional area of the pin as viewed along an axial direction of the length of the can be round, square, etc. and relatively small compared to the surface area provide by the contact element. More specifically, the contact element at the end of the conductive lead or pin can be configured to have a larger corresponding surface area for attaching the axial end of the respective conductive lead to the host circuit board as compared to a cross-sectional area of the respective conductive lead as viewed along an axial direction of the respective conductive lead.

In one embodiment, the contact element at an end of each pin (e.g., conductive lead) is an L-shaped bend of the respective conductive lead for connecting to a corresponding surface mount pad of the host circuit board.

In yet another embodiment, a contact element at an end of each pin is a J-shaped bend of the respective conductive lead for connecting to a corresponding surface mount pad of the host circuit board.

Note that techniques herein are well suited for packaging electronic circuits and providing corresponding connectivity as described herein. However, it should be noted that configurations herein are not limited to such use and thus configurations herein and deviations thereof are well suited for use in other environments as well.

It is to be understood that certain embodiments herein include manufacturing equipment including a computer system and corresponding software for carrying out steps to manufacture the devices as described herein.

Note that embodiments of the present disclosure include hardware (e.g., computer systems, manufacturing equipment, tooling, etc.) and/or software programs to perform any of the method embodiment steps and operations summarized above and disclosed in detail below. In one embodiment, the manufacturing equipment to create the enhanced pins can include a computer system (e.g., a processor) to execute instructions stored in memory to carry out operations such as: i) receiving an assembly of a circuit device mounted on a surface of a substrate, the assembly including multiple conductive leads extending, in an orthogonal manner relative to the surface, through the substrate to electrically connect the circuit device to a host circuit board; and ii) producing each respective conductive lead of the multiple conductive leads to have a contact element at an axial end of the respective conductive lead opposite the substrate to attach the axial end of the respective conductive lead to a surface mount pad of the host circuit board, the contact element at the axial end of the respective conductive lead having a larger surface area for attaching the axial end of the respective conductive lead to the host circuit board than a cross-sectional area of the respective conductive lead as viewed along an axial direction of the respective conductive lead.

Additional embodiments include manufacturing equipment and/or executable switch instructions configured to carry operations such as: i) receiving a conductive lead to be used to connect a circuit to a corresponding surface mount pad of a circuit board; ii) forming a first axial end of the conductive lead to include a contact element at an axial end of the conductive lead for connecting to the corresponding subject matter pad; and iii) forming a second axial end of the conductive lead for extending, in an orthogonal manner relative to a surface of a substrate to which the circuit is attached, through the substrate to electrically connect the circuit to the corresponding surface mount pad.

Although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Also, note that this summary section herein does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives (permutations) of the invention, the reader is directed to the Detailed Description section and corresponding figures of the present disclosure as further discussed below.

BRIEF DESCRIPTION OF THE DRAWINGS

The foregoing and other objects, features, and advantages of the present application will be apparent from the following more particular description of preferred embodiments of the present disclosure, as illustrated in the accompanying drawings in which like reference characters refer to the same parts throughout the different views. The drawings are not necessarily to scale, with emphasis instead being placed upon illustrating the embodiments, principles and concepts.

DETAILED DESCRIPTION

Figure 1:
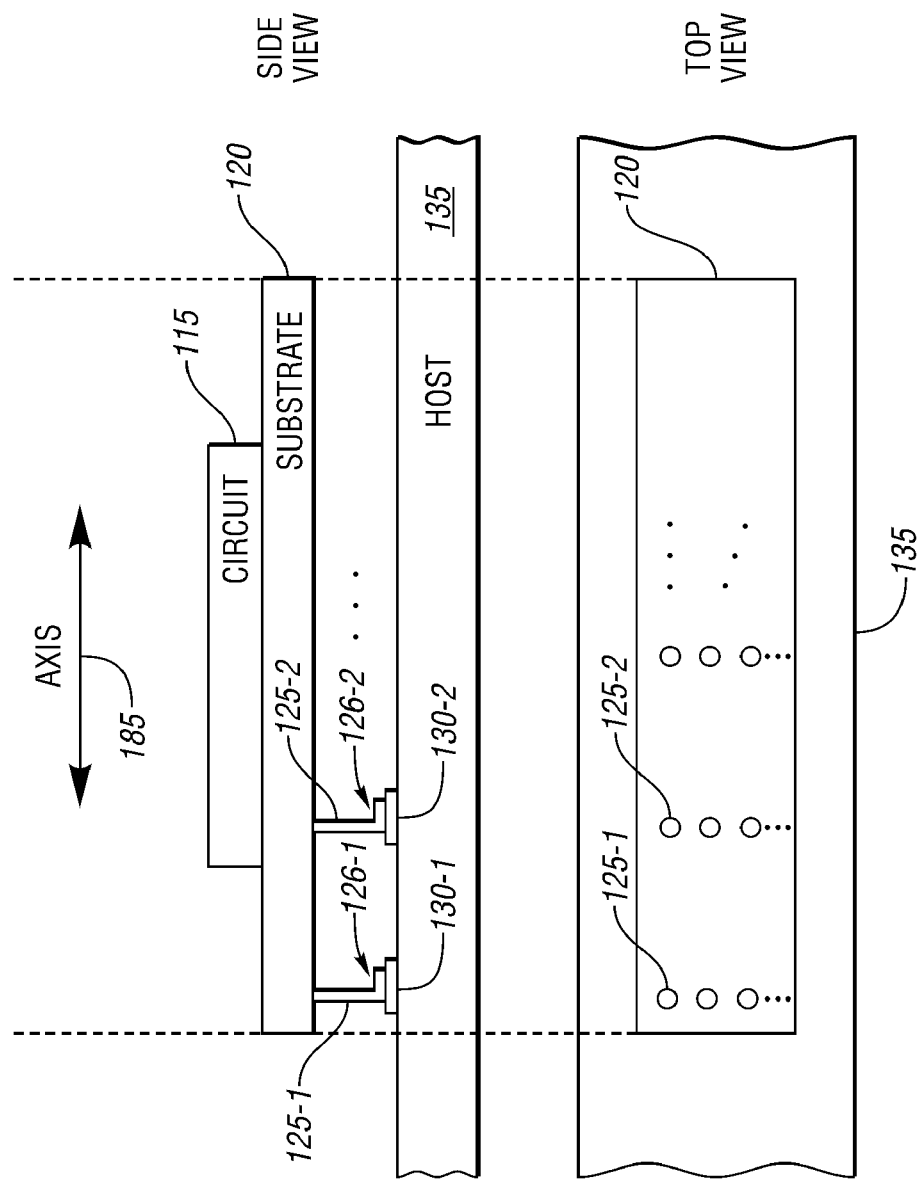
FIG. 1 is a diagram illustrating a side view and top view of an example circuit assembly and packaging according to embodiments herein.

FIG. 1 is a diagram illustrating an example side view and top view of a corresponding configuration for connecting a circuit package (e.g., a combination of circuit 115, substrate 120, and conductive leads 125) to a corresponding host substrate (e.g., host circuit board 135) according to embodiments herein. As shown, circuit 115 (e.g., an integrated circuit, chip, semiconductor device, etc.) is mounted to a surface of substrate 120. The circuit package can include another substrate disposed above and on the sides of the circuit 115 to protect the circuit 115 from damage when mounted to a corresponding circuit board.

Substrate 120 can be a material such as ceramic, plastic, etc.

As shown, multiple conductive leads 125 (e.g., conductive lead 125-1, conductive lead 125-2, conductive lead 125-3, . . . ) extend, in an orthogonal manner relative to a surface of substrate 120, through the substrate 120 to electrically connect the circuit 115 (e.g., a semiconductor circuit) to a host circuit board 135 (e.g., a substrate such as a printed circuit board, a flex circuit board, etc.). The conductive leads 125 (when soldered to corresponding surface mount pads of host circuit board 135) provide a conductive path between circuit 115 and other components residing on host circuit board 135.

The conductive leads 125 can be made from different metals as in known in the art.

According to the embodiment shown, each of the respective conductive leads 125 has a corresponding contact element 126 at an axial end of the respective conductive lead 125 opposite the substrate 120 to attach the axial end of the respective conductive lead 125 to a surface mount pad 130 of the host circuit board 135. As described herein, the contact element disposed at the axial end can vary depending on the embodiment.

The substrate 120 can include any number of pins (e.g., conductive leads 125) depending on the embodiment. For example, in one embodiment, the substrate 120 includes 2500 pins (e.g., a 50 pin×50 pin configuration) for electrically connecting circuit 115 to the host circuit board 135. In such an embodiment, the substrate 120 can be (from a top view looking down) approximately 5 centimeters by 5 centimeters. The spacing between conductive leads can be 1 millimeter. Note that this embodiment has been presented for illustrative purposes only. For example, the number of pins, size of a package, etc. can vary depending on the embodiment.

In one embodiment, a length of the pins (i.e., conductive leads 125) can be selected such that the substrate 120 is spaced 1 to 4 millimeters from the host circuit board 135 when the ends of corresponding conductive leads 125 are soldered to corresponding surface mount pads 130 of host circuit board 135. Typically, the pin length is on the order of 2 millimeters. Note that the pin length range of conductive leads 125 as mentioned above (e.g., 0.5 to 3 millimeters) is presented as an example and that the length of conductive leads can be generally be any length to space the substrate 120 from the host circuit board 135. Longer pin lengths (e.g., pin lengths greater than 4 millimeters) can be used to provide a greater spacing between the substrate 120 and the host circuit board 135. Conversely, shorter pin lengths (e.g., pin lengths less than 1 millimeter) can be used to provide a smaller spacing between the substrate 120 and the host circuit board 135.

Figure 2:
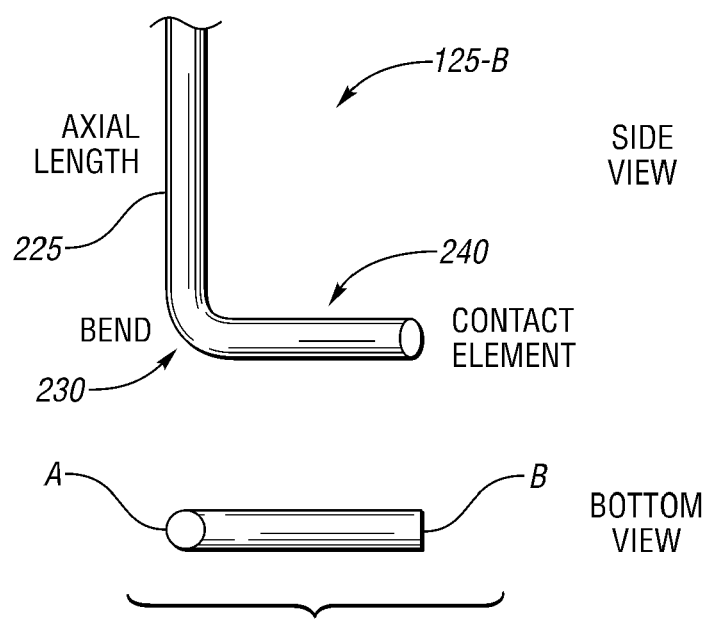
FIG. 2 is a diagram of a side view and a cross-sectional view of an example conductive lead according to embodiments herein.
Figure 3:
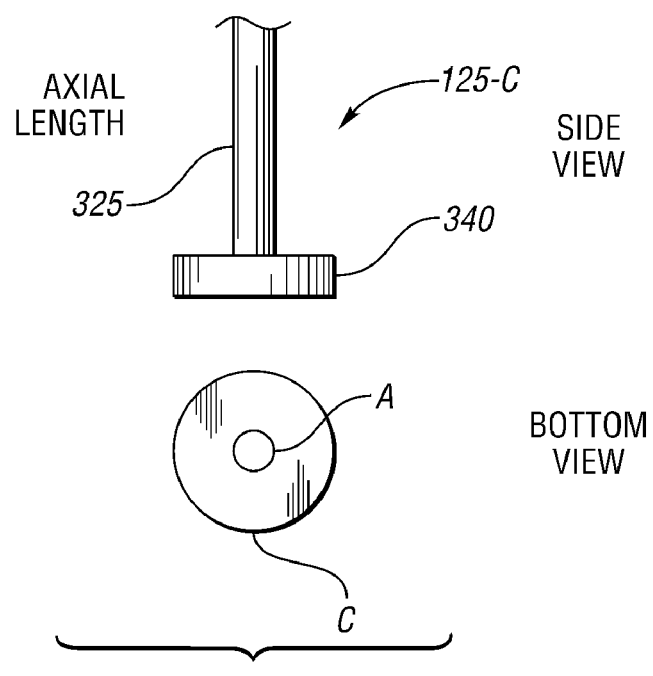
FIG. 3 is a diagram of a side view and a cross-sectional view of an example conductive lead according to embodiments herein.

As mentioned above, a configuration of the contact elements 126 (e.g., contact element 126-1, contact element 126-2, contact element 126-3, . . . ) can vary depending on the embodiment. For example, FIG. 2 is an example diagram illustrating how axial ends of the conductive leads 125 can be bent into an L-shape according to embodiments herein. FIG. 3 is an example diagram illustrating how axial ends of the conductive leads 125 can be modified or configured to include a disc-shaped contact element according to embodiments herein. According to these and other such embodiments, the contact elements 126 (or altering of the axial ends of conductive leads 125 as described herein) provide better connectivity of conductive leads 125 with corresponding surface mount pads 130 because of the increased surface area afforded by the contact elements 126.

For illustrative purposes, assume that the circuit package comprising circuit 115, substrate 120, and conductive leads 125 is a conventional pin grid array package. According to such a configuration, each pin can be configured as a cylindrical post for inserting into a connector or through-hole on a circuit board to which the package is mounted. Instead of mounting the pin grid array to a host circuit board via though-hole technology, the ends of the pins can be modified (in a manner as described herein) to provide better contact with corresponding surface mount pads 130 on the host circuit board 135. For example, ends of the pins can be bent into an "L" or "J" shape such that there is more surface for the pin to connect to the surface mount pad 130 of the host circuit board. Thus, according to embodiments herein, pins of a conventional pin grid array device can be altered to accommodate surface mounting the package to a host circuit board 135.

A benefit of providing a stronger connection between the pins and the host circuit board 135 is to reduce the likelihood that the pins will disconnect from the corresponding surface mount pad 130 in response to changes in temperature. For example, the substrate 120 may have a different coefficient of expansion than the coefficient of expansion associated with the host circuit board 135. Thus, the substrate 120 and the host circuit board 135 expand different amounts along axis 185 depending on a change in temperature. Under such conditions, there is a different amount of stress placed on the solder joint connecting the end of the pins to the surface mount pads 130. If the stress becomes too great, the solder connection between the pins and the surface mount pads 130 will fail (e.g., break). Providing the bend or increased surface area for connecting the end of the conductive leads 125 to the surface mount pads 130 reduces the likelihood of a joint failure because of the extra holding strength provided by the increased surface area of the contact element to attach to the surface mount pad of the host circuit board 135. Thus, embodiments herein provide higher reliability than do conventional methods.

Also, as mentioned above, there has been an ever-growing need to provide yet more and more pins on packaging of a circuit device. For example, the example integrated circuit as described herein can include up to or more than 2500 pins (e.g., a 50×50 array of pins). It would be very difficult if not impossible with today's technology to provide such a high pin count using conventional Gull-wing or J-lead type packages in which the conductive leads extend laterally outward from a periphery of the device and are bent to connect to surface mount pads. As described herein, the conductive leads 125 as shown in FIG. 1 can extend in an orthogonal manner underneath the substrate 120 to the host substrate such as the host circuit board 135. Thus, the effective area consumed by a package according to embodiments herein is smaller because the pins are underneath the substrate (e.g., the conductive leads are orthogonal to the surface of substrate 120 on which the circuit 115 is mounted) as opposed to extending outward from the substrate as in a conventional gull-wing pin lead design. The extra area saved on the host circuit board 135 according to embodiments herein can be used for populating the host circuit board with other circuit components.

Accordingly, a perimeter surface area of the host circuit board 135 (e.g., the surface area of the substrate shown in the top view of FIG. 1) beneath the substrate 120 and encompassing bent leads (or other forms of contact elements as described herein) at ends of the conductive leads 125 and corresponding pads 130 on the host circuit board 135 is smaller than a perimeter of the package in a plane parallel to the surface of the substrate. In other words, there is no need for the conductive leads 125 and pads 130 to fall outside the top view perimeter of substrate 120 because the pins are orthogonal with respect to the substrate 120 and lie beneath substrate 120. In contradistinction, as discussed above, conventional gull-wing leads extend laterally outward from a circuit package and take up real estate on a corresponding circuit board.

Note additionally that embodiments herein provide advantages over other types of packages such as conventional ball grid arrays having high pin counts. The conventional ball grid array package is a rigid design (in which there is relatively little flexibility associated with the solder joints) and is therefore susceptible to damage when exposed to temperature variations. The conductive leads 125 according to embodiments herein provide a standoff and thus raise the substrate 120 above the host circuit board 135 via flexible metal posts (e.g., pins). The conductive leads 125 thus provide flexibility when the substrate 120 and the host circuit board 135 expand and contract along axis 185 by different amounts during temperature swings. In other words, stresses to the solder joints formed between the contact elements 126 and the surface mount pad 130 as a result of expansion and contraction of the substrate 120 relative to the host circuit board 135 are mitigated based on the flexibility afforded by conductive leads 125 (e.g., metal posts). Additionally, the increased surface area of the bent leads relative to the corresponding surface mount pads enables more solder to collect and form a good conductive connect as well as a good physical connect between the pin (e.g., a pin grid array pin) and a surface mount pad.

FIG. 2 is an example diagram illustrating side view and cross-sectional view of a bent (e.g., L-shape as produced by bend 230) conductive lead for providing more surface area to connect an end of a corresponding conductive lead 125-B to a surface mount pad 130 according to embodiments herein. In general, FIG. 2 illustrates how bending an axial end of a conductive lead 125-B results in greater surface area for connecting the conductive lead to a corresponding surface mount pad.

For example, a side view of the conductive lead 125-B (after bending) illustrates creation of contact element 240 based on bending (in approximately an orthogonal manner) a tip of the conductive lead 125-B relative to an axial length 225 of the conductive lead 125-B as shown. As previously discussed, the end of the conductive lead 125-B opposite the contact element 240 is substantially orthogonal to a surface of the substrate 120 to which the circuit 115 is attached.

Note that the term substantially orthogonal and orthogonal as used herein can include a range of angles between 80 and 100 degrees.

The bottom view in FIG. 2 illustrates the increased amount of surface area achieved by bending the tip of conductive lead 125-B. Without bend 230, the cross-section surface area for connecting to the surface mount pad would be equivalent to area A. Bending the tip of the conductive lead 125-B and creating contact element 240 having surface area B as shown can substantially increase an amount of surface area for soldering the end of the conductive lead 125-B to a corresponding surface mount pad 130.

Accordingly, the contact element 240 at the axial end of the respective conductive lead 125-B (opposite the substrate 120) has a larger surface area (e.g., surface area B) for attaching the axial end of the respective conductive lead 125-B to a surface mount pad of the host circuit board 120 than corresponding cross-sectional area of the respective conductive lead (e.g., surface area A) as viewed along an axial direction (e.g., along axis 225) of the respective conductive lead 125-B. Thus, providing a contact element and/or altering the axial end of a conductive lead 125-B enhances connectivity according to embodiments herein.

In one embodiment, the conductive lead 125-B has a diameter of 0.2-0.3 millimeters. The length of conductive lead 125-B from substrate 120 to surface mount pad 130 is between 0.5 and 3 millimeters. The length of contact element 240 (below the bend 230) is on the order of 0.1 to 1 millimeter.

Of course, the example dimensions as described above are for illustrative purposes only. In general, conductive lead 125-B and corresponding contact element 240 can be configured to have any reasonable dimension and shape.

As previously discussed, the substrate 120 can include a multiple-dimensional array of conductive leads 125 for electrically connecting circuit 115 on substrate 120 to the host circuit board 135. Note that the bend of each conductive lead (e.g., pin) can be in the same direction. In other embodiments, the conductive leads 125 can be bent in different directions with respect to each other and/or the substrate 120 depending on where the conductive lead 125 is in the array of pins.

FIG. 3 is a diagram illustrating a side view and a bottom view of an example contact element 340 according to embodiments herein. As shown in this example embodiment, the contact element 340 at an end of conductive lead 125-C is disc-shaped (note that it can be other shapes as well) in order to enlarge a surface area of the conductive lead 125-C for collection of solder to connect the end of the lead to a corresponding surface mount pad. For example, a side view of the conductive lead 125-1 (after adding or creating a disc or enlarged contact area of metallic material) at a tip of the conductive lead 125-C relative to an axial length 325 of the conductive lead 125-C is shown.

The bottom view in FIG. 2 illustrates the increase in surface area achieved by including or fabricating the contact element 340 (e.g., disc) to the tip of conductive lead 125-C for creating an enhanced solder connect according to embodiments herein. Without contact element 340, the cross-section surface area of an unaltered pin or post for connecting the conductive lead 125-C to a surface mount pad would be equivalent to area A, which allows for only a minimal, weak solder joint. Altering the end of the conductive lead 125-C and providing the contact element 340 at the tip of the conductive lead 125-C having surface area C as shown can substantially increase an amount of surface area for soldering the end of the conductive lead 125-C to a corresponding surface mount pad 130.

Accordingly, embodiments herein include producing the contact element 340 to be a disc-shaped conductive element disposed at the axial end of the conductive lead 125-C.

The disc-shaped conductive element has a larger corresponding surface area for attaching the axial end of the respective conductive lead 125-C to the host circuit board 135 than the cross-sectional area of the respective conductive lead as viewed along an axial direction 325 of the respective conductive lead 125-C. Thus, the contact element 340 provides an enlarged amount of surface area (e.g., metallic mass) to create a respective solder joint and increase holding strength of the connection between the conductive lead 125-C and the surface mount pad 130-C.

In an example embodiment, the conductive lead 125-C has a diameter of 0.15-0.2 millimeters. The length of conductive lead 125-C from substrate 120 to surface mount pad 130 in example embodiment is between 1 and 4 millimeters, but can be any length as discussed above. An example thickness of the contact element 340 (as measured along axial length 325) is 0.05 to 0.25 millimeters. A diameter of the contact element 340 (as viewed along axial length) can be any value greater than the diameter of the conductive lead 125-C such as 0.2-0.7 millimeters. Again, these example dimensions as described above are for illustrative purposes only. In general, conductive lead 125-C can be configured to have any reasonable dimensions and shape to enhance connecting of the conductive lead 125 to a corresponding surface mount pad.

Note also that an exact shape associated with contact element 340 can vary depending on the embodiment. For example, the contact element need not be disc-shaped to provide an increased surface area.

Figure 4:
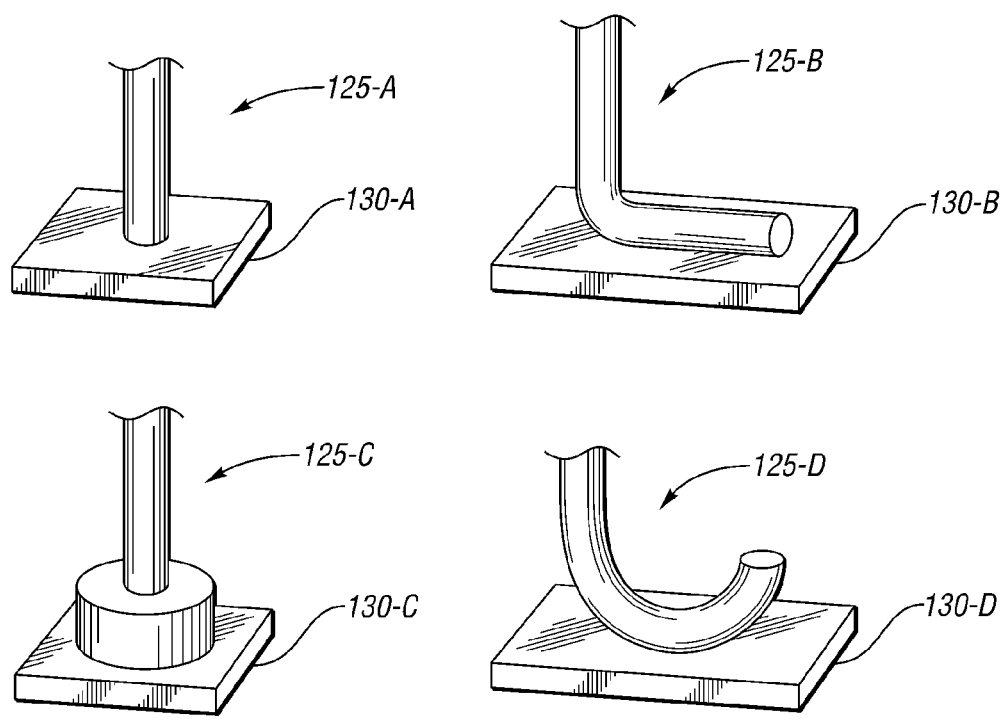
FIG. 4 is a pictorial diagram illustrating different types of example conductive leads and attachment to a corresponding surface mount pad of a host circuit board according to embodiments herein.

FIG. 4 is a pictorial diagram illustrating examples of different styles of conductive leads according to embodiments herein. As shown, an example conductive lead 125-A forms a columnar metallic post for electrically connecting (e.g., via a solder joint) attaching conductive lead 130-A to surface mount pad 130-A. Conductive lead 125-B forms an L-shaped bend for electrically connecting conductive lead 130-B to surface mount pad 130-B. Conductive lead 125-C forms a disc-shaped contact element for electrically connecting conductive lead 130-C to surface mount pad 130-C. Conductive lead 125-D forms a disc-shaped contact element for electrically connecting conductive lead 130-D to surface mount pad 130-D.

Note that conductive lead 125-B, conductive lead 125-C, and conductive lead 125-D each has increased surface area for mounting to a corresponding surface mount pad as compared to the metallic post associated with conductive lead 125-A.

Figure 5:
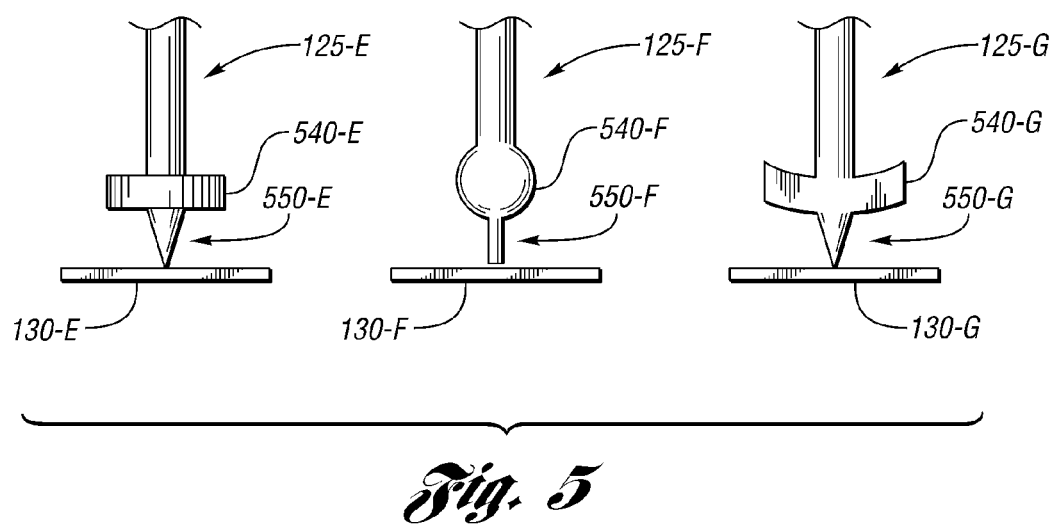
FIG. 5 is an example diagram of a standoff to provide spacing between pins of a circuit package and surface mount pads of a host circuit board according to embodiments herein.

FIG. 5 is an example diagram illustrating more example shapes of contact elements as well as corresponding example standoffs according to embodiments herein. For example, the contact elements 540 (e.g., contact element 540-E, contact element 540-F, and contact element 540-G) illustrate a number of different acceptable shapes for providing more surface area to create a solder joint with a corresponding surface mount pad 130. Contact element 540-E is disc-shaped and can be concave up or down. Contact element 540-F is spherical. Contact element 540-G is an example side view of a concave disc or a T-shaped mass at an end of a corresponding conductive lead 125.

In addition to providing a contact element at an end of a corresponding conductive lead 125 as discussed above, embodiments herein can include providing a standoff 540 (e.g., standoff 540-E, standoff 540-F, and standoff 540-G) to raise or space the respective contact element 540 from the corresponding pad 130 on the host circuit board 135. This spacing allows extra solder to connect the end of the conductive lead to a corresponding surface mount pad of a host circuit board.

Thus, embodiments herein include providing a standoff disposed between the contact element 540 of a respective pin and a pad 130 (e.g., pad 130-E, pad 130-F, and pad 130-G) of the host circuit board 135. As its name suggests, the standoffs 550 (e.g., spacers) provide a spacing and prevent the contact elements at ends of the conductive leads from touching corresponding surface mount pads of the host circuit board. As mentioned above, when so used, the standoffs enable more solder to be deposited between the contact element and the surface mount pad, enhancing a strength of a corresponding solder joint. This increases reliability. The contact elements 540 can provide a function such as preventing the solder (when so formed between a contact element and surface mount pad) from wicking too high up the conductive lead 125. Thus, contact elements help to support confining of the solder to the tip of the conductive lead between the contact element and the surface mount pad.

In one embodiment, each pin of multiple linear rows of conductive pins extending through the substrate 135 to pads on the host circuit board 120 includes a standoff 550 provides a spacing of greater than 0.1 millimeter. During an operation of creating the corresponding solder joint, the standoff can come in contact with the pad of the host circuit board 135 and provide a wicking action for collection and amassing of solder to fill the space between the respective contact element 540 and the pad 130.

Figure 6:
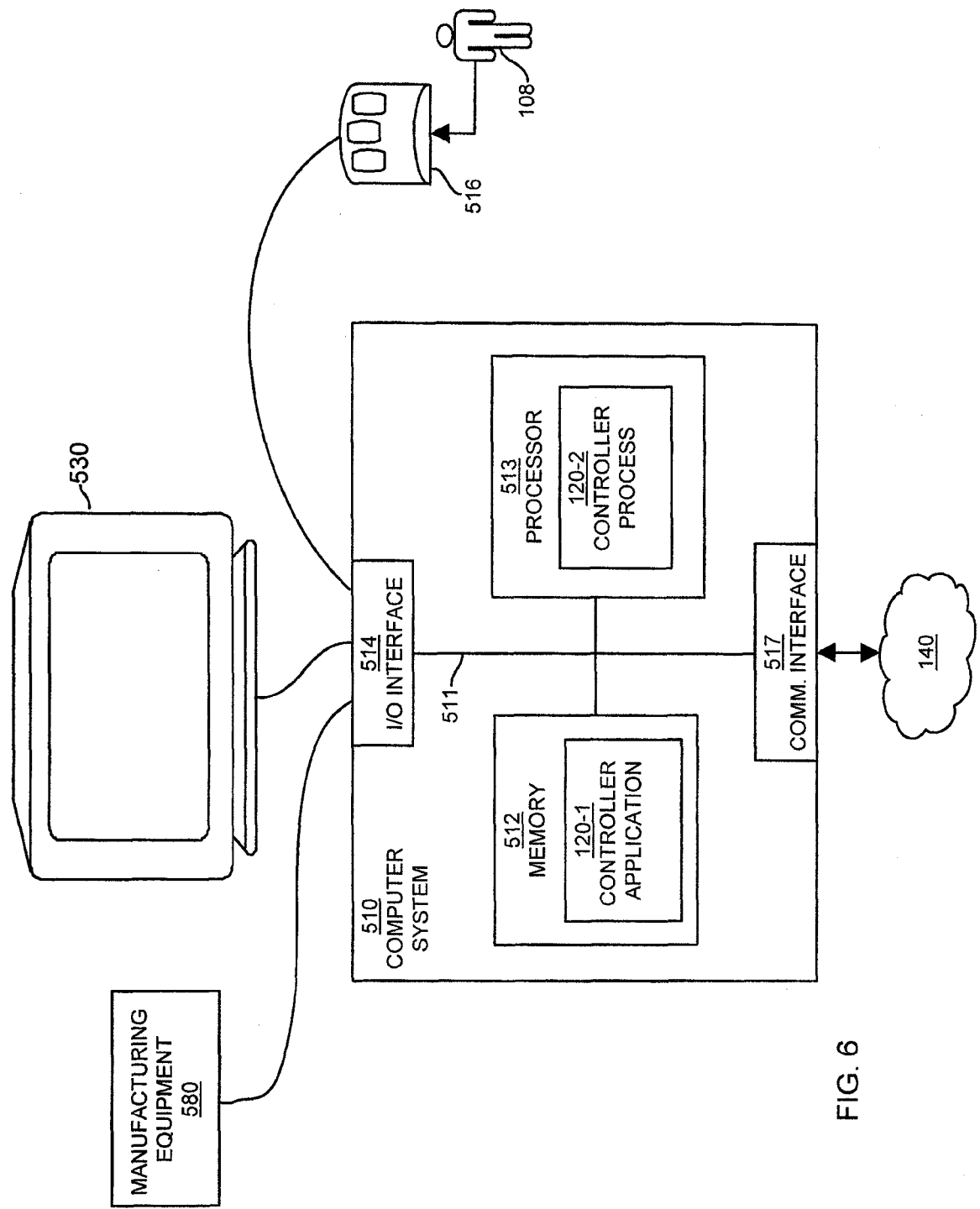
FIG. 6 is a block diagram illustrating example manufacturing equipment and a corresponding computer system for executing handling instructions to produce a circuit assembly according to embodiments herein.

FIG. 6 is a block diagram illustrating an example computer system 510 for executing a controller application 520-1 and any related functions/processes according to embodiments herein. Computer system 510 may be a computerized device such as a personal computer, workstation, portable computing device, console, network terminal, processing device, etc. Manufacturing equipment 580 includes tooling needed to alter and/or create pins of a packaging device as discussed above with respect to FIGS. 1-5. Note that computer system 510 can be included or integrated with manufacturing equipment 580.

As shown, computer system 510 of the present example includes an interconnect 511 that couples a memory system 512, a processor 513, an I/O interface 514, and a communications interface 517. I/O interface 514 enables computer system 510 to display a graphical user interface (if so used) on display screen 530. An input device 516 (e.g., one or more user/developer controlled devices such as a pointing device, keyboard, mouse, etc.) operated by user 108 couples to processor 513 through I/O interface 514, and enables a user 108 to provide input commands and generally control a corresponding graphical user interface (if any) associated with controller application 120-1 and controller process 120-2.

Communications interface 517 of computer system 510 enables computer system 510 to communicate over network 590 to transmit and receive information from different resources as is necessary to carry out manufacturing operations.

As shown, memory system 512 is encoded with controller application 120-1 supporting to control manufacturing equipment 580 according to embodiments herein. Controller application 120-1 can be embodied as software code such as data and/or logic instructions (e.g., code stored in the memory or on another computer readable medium such as a disk) that support functionality (e.g., altering ends of conductive leads of a integrated circuit package) according to different embodiments described herein.

During operation of controller application 120-1, processor 513 accesses memory system 512 via the interconnect 511 in order to launch, run, execute, interpret or otherwise perform the logic instructions of the controller application 120-1. Execution of the controller application 120-1 produces processing functionality in controller process 120-2. In other words, the controller process 120-2 represents one or more portions of the controller application 120-1 (or the entire application) performing within or upon the processor 513 in the computer system 510.

It should be noted that controller process 120-2 executed in computer system 510 can be represented by either one or both of the controller application 120-1 and/or the controller process 120-2. For purposes of this discussion and different embodiments herein, general reference will again be made to the manufacturing equipment 580 and/or controller process 150-2 as performing or supporting the various steps and functional operations as previously discussed and as will be discussed further in this specification.

As mentioned, in addition to the controller process 120-2, embodiments herein include the controller application 120-1 itself (i.e., the un-executed or non-performing logic instructions and/or data). The controller application 120-1 may be stored on a computer readable medium such as a floppy disk, hard disk, or optical medium. The controller application 120-1 may also be stored in a memory type system such as in firmware, read only memory (ROM), or, as in this example, as executable code within the memory system 512 (e.g., within Random Access Memory or RAM). In addition to these embodiments, it should also be noted that other embodiments herein include the execution of controller application 120-1 in processor 513 as the controller process 120-2. Thus, those skilled in the art will understand that the computer system 510 may include other processes and/or software and hardware components, such as an operating system that controls allocation and use of hardware resources.

Figure 7:
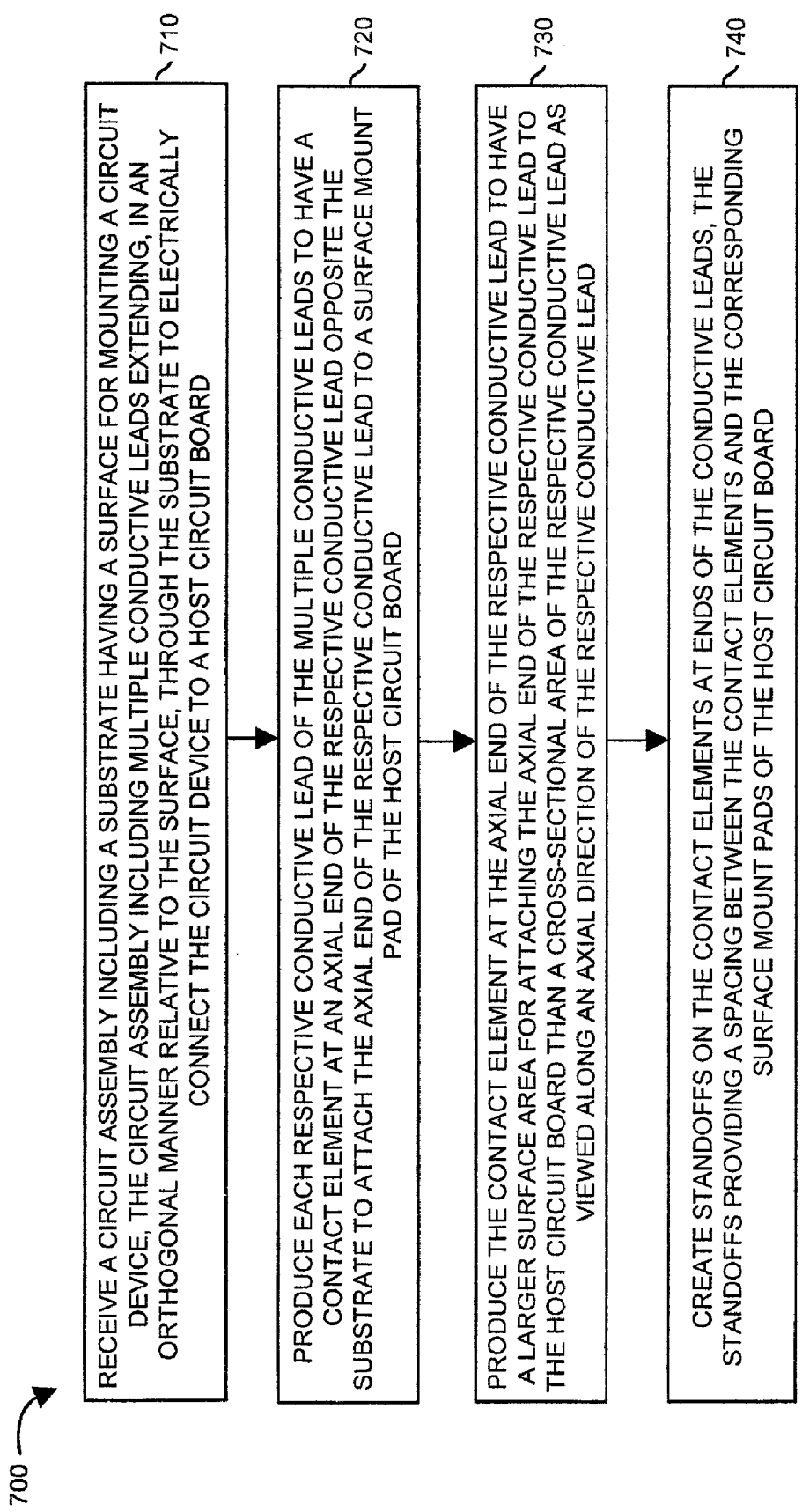
FIG. 7 is a diagram of a flowchart illustrating execution of handling instructions to produce a circuit assembly according to an embodiment herein.

FIG. 7 is a flowchart 700 illustrating example techniques supported by manufacturing equipment 580 according to embodiments herein. Note that techniques discussed in flowchart 700 overlap and summarize how to alter the ends of the conductive leads 125 as discussed above.

In step 710, the manufacturing equipment 580 receives a circuit assembly including a substrate having a surface for mounting a circuit device, the circuit assembly includes multiple conductive leads 125 extending, in an orthogonal manner relative to the surface, through the substrate 120 to electrically connect the circuit device to a host circuit board 135. As discussed above, the manufacturing equipment 580 alters an axial end of each of the conductive leads 125 to produce one or more of the different types of contact elements as shown in FIGS. 1-5. As previously discussed, altering of the conductive leads in a way as described herein enhances solder volume between the end of a pin and a surface mount pad. This increased volume of solder provides a more conductive path than is possible with conventional pin grid arrays. Additionally, the increased volume provides added physical strength so that the pin will less likely break away from the pad over the course of its life.

In step 720, the manufacturing equipment 580 produces each respective conductive lead 125 of the multiple conductive leads to have a contact element at an axial end of the respective conductive lead opposite the substrate 120 to attach the axial end of the respective conductive lead 125 to a surface mount pad 130 of the host circuit board 135.

In step 730, the manufacturing equipment 580 produces the contact element at the axial end of the respective conductive lead 125 to have a larger surface area for attaching the axial end of the respective conductive lead 125 to the host circuit board 135 than a cross-sectional area of the respective conductive lead 125 as viewed along an axial direction of the respective conductive lead 125.

In step 740, the manufacturing equipment 580 creates standoffs on the contact elements at ends of the conductive leads 125. The standoffs are configured to provide a spacing (or spacings) between the contact elements and the corresponding surface mount pads 130 of the host circuit board 135.

Note that the manufacturing equipment 580 as described herein can include instructions to support operations such as creating pins for eventual attachment to a circuit package (e.g., substrate 120 and circuit 115). In such an embodiment, the manufacturing equipment 580 (and corresponding computer system) supports steps of: i) receiving a conductive lead 125 to be used to connect a circuit 115 to a corresponding surface mount pad 130 of a circuit board; ii) forming a first axial end of the conductive lead 125 to include a contact element (as discussed above) at an axial end of the conductive lead 125 for connecting to the corresponding surface mount pad 130 of the circuit board; and iii) forming a second axial end of the conductive lead 125 for extending, in an orthogonal manner relative to a surface of a substrate 120 to which the circuit 115 is attached, through the substrate 120 to electrically connect the circuit to the corresponding surface mount pad 130.

As discussed above, techniques herein are well suited for use in applications such as those that support generation and mounting of circuit packages on a host circuit board as described herein. However, it should be noted that configurations herein are not limited to such use and thus configurations herein and deviations thereof are well suited for use in other environments as well.

While this invention has been particularly shown and described with references to preferred embodiments thereof, it will be understood by those skilled in the art that various changes in form and details may be made therein without departing from the spirit and scope of the present application as defined by the appended claims. Such variations are covered by the scope of this present disclosure. As such, the foregoing description of embodiments of the present application is not intended to be limiting. Rather, any limitations to the invention are presented in the following claims. Note that the different embodiments disclosed herein can be combined or utilized individually with respect to each other.

I claim:

1. An apparatus comprising:
a circuit;
a substrate having a surface on which the circuit is mounted;
multiple conductive leads extending, in an orthogonal manner relative to the surface, through the substrate to electrically connect the circuit to a host circuit board, each conductive lead having a contact element at an axial end thereof opposite the substrate to attach the axial end of the respective conductive lead to a surface mount pad of the host circuit board, wherein each contact element has a larger surface area than a cross-sectional area of the respective conductive lead as viewed along an axial direction of the respective conductive lead; and
a standoff disposed on each contact element, each standoff having a smaller cross-sectional area than the cross-sectional area of the respective conductive lead as viewed along the axial direction of the respective conductive lead, the standoffs providing a spacing between the contact elements and the corresponding surface mount pads of the host circuit board, the spacing and the smaller cross-sectional areas of the standoffs allowing a deposit of solder between each contact element and the corresponding surface mount pad whereby the solder deposit contacts a surface area of the contact element greater than a surface area of the respective standoff and substantially equal to a surface area of the corresponding surface mount pad to enhance a strength of a solder joint formed between the contact element and the corresponding surface mount pad.

2. The apparatus as in claim 1, wherein the contact element is a disc-shaped conductive element disposed at the axial end of the conductive lead.

3. The apparatus as in claim 1, wherein the contact element of the respective conductive lead is an L-shaped bend of the respective conductive lead for connecting to a corresponding surface mount pad of the host circuit board.

4. The apparatus as in claim 1, wherein the contact element of the respective conductive lead is an J-shaped bend of the respective conductive lead for connecting to a corresponding surface mount pad of the host circuit board.

5. The apparatus as in claim 1, wherein the circuit is a semiconductor circuit and the substrate is part of a semiconductor package protecting the semiconductor circuit.

6. The apparatus as in claim 5, wherein a perimeter surface area of the host circuit board beneath the substrate and encompassing bent ends of the conductive leads and corresponding pads on the host circuit board is smaller than a perimeter of the package in a plane parallel to the surface of the substrate.

7. The apparatus as in claim 1, wherein the multiple conductive leads include multiple linear rows of conductive pins extending, in an orthogonal manner relative to the surface, through the substrate to corresponding surface mount pads of the host circuit board; and
wherein ends of the conductive pins opposite the substrate are bent substantially perpendicular relative to axial length of the respective conductive leads for connecting the ends of the conductive pins to corresponding pads of the host circuit board.

8. The apparatus as in claim 7, wherein each of the multiple conductive pins is bent in the same direction.

9. The apparatus as in claim 8, wherein the substrate is a ceramic substrate.

10. The apparatus as in claim 9, wherein the multiple linear rows of conductive pins provide a spacing of at least 0.05 millimeters between the contact element of a respective conductive lead and a corresponding pad of the host circuit board.

* * * * *